(12) United States Patent
Seo et al.

(10) Patent No.: US 8,551,874 B2
(45) Date of Patent: Oct. 8, 2013

(54) MOSFET GATE AND SOURCE/DRAIN CONTACT METALLIZATION

(75) Inventors: Soon-Cheon Seo, Glenmont, NY (US);
Bruce B. Doris, Brewster, NY (US);
Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 12/776,369

(22) Filed: May 8, 2010

(65) Prior Publication Data
US 2011/0272765 A1    Nov. 10, 2011

(51) Int. Cl.
*H01L 21/3205*    (2006.01)

(52) U.S. Cl.
USPC .......... 438/586; 438/305; 438/581; 438/583; 438/629; 438/630; 438/233; 257/410; 257/411; 257/412; 257/413; 257/E21.409; 257/E29.255; 257/E21.577; 257/E21.583; 257/E21.585; 257/E21.635

(58) Field of Classification Search
USPC ......... 438/233, 305, 581, 583, 586, 629–631, 438/633, 649, 651, 655, 664, 682, 721, 438/755; 257/410–413, 454–456, 486, 576, 257/754–757, 768–770, E29.156, E29.255, 257/E21.006, E21.19, E21.151, 257/E21.164–E21.165, E21.199, E21.2, 257/E21.203, E21.296, E21.409, E21.439, 257/E21.593, E21.619–E21.623, E21.634, 257/E21.635
See application file for complete search history.

(56) References Cited

U.S. PATENT DOCUMENTS

| | | | |
|---|---|---|---|
| 2005/0051854 A1 | 3/2005 | Cabral, Jr. | |
| 2005/0055494 A1 | 3/2005 | Doris | |
| 2006/0220141 A1* | 10/2006 | Besser | 257/371 |
| 2007/0141798 A1 | 6/2007 | Bohr | |
| 2008/0102571 A1 | 5/2008 | Pan | |
| 2008/0105910 A1 | 5/2008 | Matsuki | |
| 2008/0242037 A1 | 10/2008 | Sell | |

OTHER PUBLICATIONS

Nguyen et al., "Alternative Method of Making Self-Aligned MESFET Transistors", IP.COM No. IPCOM000039236D, Publication Date: May 1, 1987, IP.COM Electronic Publication: Feb. 1, 2005 (IBM TDB, V. 29: n. 12; May 1987).

* cited by examiner

*Primary Examiner* — Yasser Abdelaziez
(74) *Attorney, Agent, or Firm* — Louis J. Percello; Robert M. Trepp

(57) ABSTRACT

A MOSFET is described incorporating a common metal process to make contact to the source, drain and the metal gate respectively which may be formed concurrently with the same metal or metals.

16 Claims, 9 Drawing Sheets

MOSFET GATE AND SOURCE/DRAIN CONTACT METALLIZATION

BACKGROUND

The present invention relates to MOSFET metallization in semiconductor chips and more specifically, to gate, source and drain metallization.

Typically, metallization for high K metal gates of MOSFET's and source/drain contacts is done separately using different metals.

SUMMARY

A method for fabricating a transistor having a source, drain and channel regions in a Si containing substrate exposed through openings in a dielectric layer, the opening to the channel region having sidewall spacers, is described comprising forming a metal silicide in the source and drain regions, forming a high K dielectric layer is the channel region, forming a metal gate layer over the high K dielectric layer, forming a first metal liner layer over the metal silicide in the source and drain regions and over the metal gate layer and over the sidewalls of the openings in the dielectric layer, forming a second metal layer over the first metal liner layer and having a thickness to fill the openings, and planarizing the first metal liner layer and the second metal layer down to the dielectric layer.

The invention further provides an alternate method where forming a high K dielectric layer in the channel region and forming a metal gate layer over the high K dielectric layer is performed before forming a metal silicide in the source and drain regions.

The invention further provides as one embodiment of the present invention, a field effect transistor comprising a semiconductor substrate of a first type, a high K dielectric on said substrate, a first metal having a first work function over the high K dielectric forming a metal gate, a first spacer adjacent to respective sides of the metal gate, a source and drain of a second type spaced apart adjacent to respective sidewall spacers on the opposite sides of the metal gate in the substrate to form a channel there between, and a dielectric layer having a first thickness above the substrate having a first opening to the source region, a second opening to the drain region, the first and second openings having a metal silicide layer on the source and drain region and a third opening to the metal gate, the first and second openings having a first metal on the first metal silicide at the bottom and on sidewalls and a second metal over the first metal filling the first and second openings, the first metal extending from the metal gate over sidewalls of the first and second spacers and on sidewalls of the third opening and a second metal over the first metal filling the third opening.

BRIEF DESCRIPTION OF THE SEVERAL VIEWS OF THE DRAWING

These and other features, objects, and advantages of the present invention will become apparent upon consideration of the following detailed description of the invention when read in conjunction with the drawing in which.

DETAILED DESCRIPTION

Figure 1:
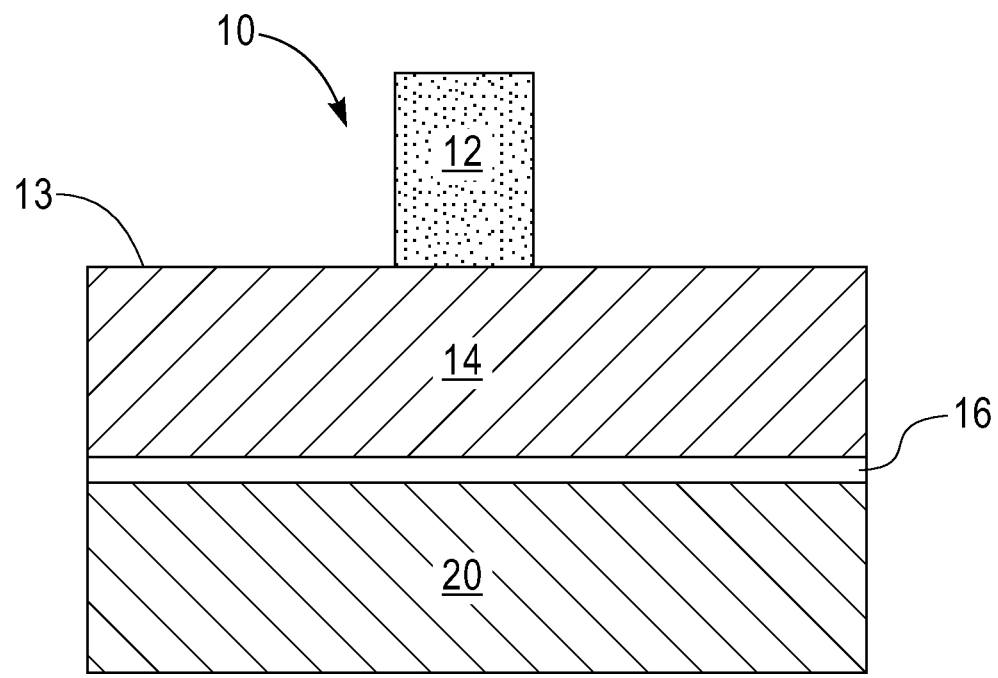
FIG. 1 is a cross section view of a semiconductor structure showing a patterned resist on a polysilicon or amorphous layer which is on a high K layer which in turn is on a semiconductor substrate illustrating a process step.

Referring now to the drawing, a process for forming a metal oxide silicon field effect transistor (MOSFET) having a common contact metal for the source/drain and gate electrodes is illustrated. FIG. 1 is a cross section view of semiconductor structure 10 comprising a patterned resist 12 on upper surface 13 of Si layer 14. Patterned resist 12 may comprise the shape of a sacrificial gate electrode to be used to pattern Si layer 14. Si layer 14 may comprise polysilicon or amorphous Si (a-Si) which will comprise the material of a sacrificial Si gate electrode to be formed. Si layer 14 is formed on dielectric layer 16 which may, for example, have a high dielectric constant K (high K) material and which will function as a sacrificial gate dielectric of a MOSFET after patterning. Dielectric layer 16 is formed on semiconductor substrate 20. Semiconductor substrate 20 may be single crystal and doped p type or n type depending on the type of MOSFET to be formed.

Figure 2:
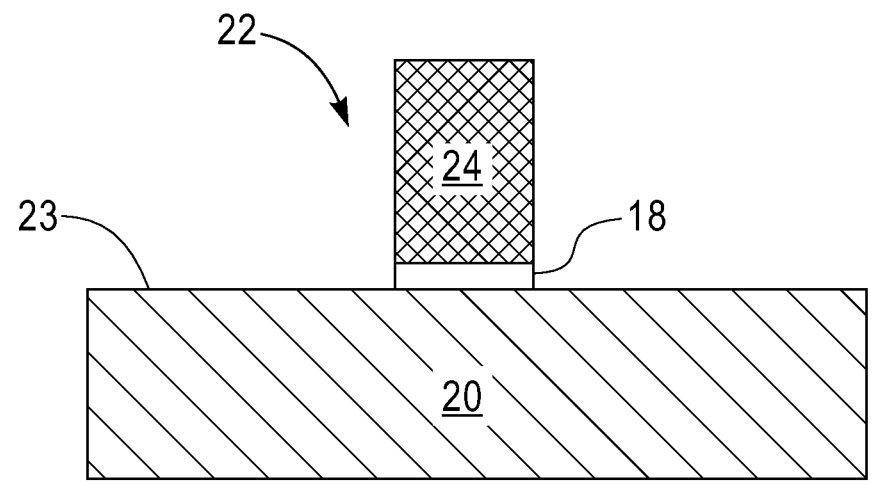
FIG. 2 is a cross section view of a semiconductor structure showing a sacrificial Si gate electrode and a high K dielectric layer patterned on a semiconductor substrate.

FIG. 2 is a cross section view of semiconductor structure 22 after Si layer 14 and dielectric layer 16 are patterned using patterned resist 12 as a mask. Si layer 14 and dielectric layer 16 may be patterned down to the upper surface 23 of semiconductor substrate 20, for example, by Reactive Ion Etching (RIE) to form sacrificial Si gate 24 and sacrificial gate dielectric 18. After patterning Si layer 14 to form sacrificial Si gate 24 and dielectric layer 16 to form sacrificial gate dielectric 18, patterned resist 12 is removed.

Figure 3:
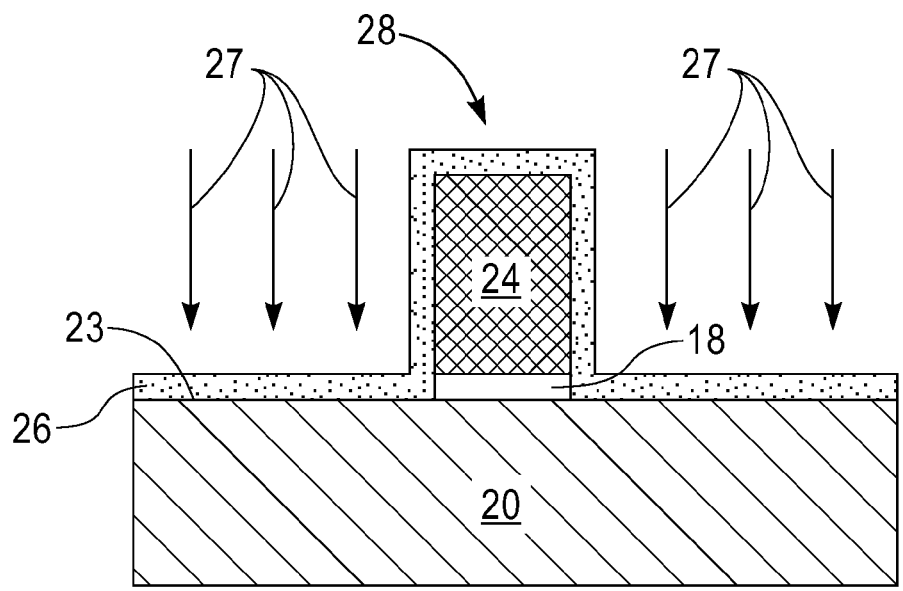
FIG. 3 is a cross section view of FIG. 2 after a first spacer layer had been formed over the sacrificial Si gate electrode and high K dielectric layer during a plasma etch.

FIG. 3 is a cross section view of FIG. 2 after a first spacer layer 26 is formed over sacrificial Si gate 24 and upper surface 23 of semiconductor substrate 20 forming structure 28. First spacer layer 26 may comprise, for example, $SiO_2$, carbon doped oxide, boron nitride, silicon nitride, perfluorocyclobutane (PFCB), fluorosilicate glass (FSG), any stress memory dielectric materials, and low K materials where K is less than 4. First spacer layer 26 may have a thickness in the range from 5% to 30% of the minimum gate length. First spacer layer 26 is removed over upper surface 23 and over sacrificial Si gate 24 shown in FIG. 4 by a plasma etch shown by arrows 27 in FIG. 3.

Figure 4:
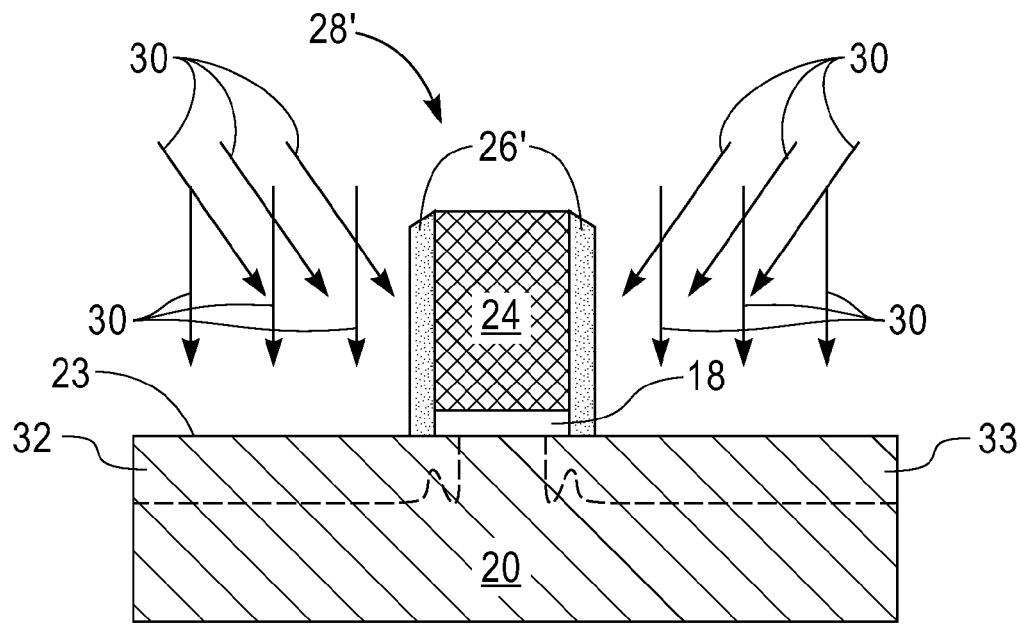
FIG. 4 is a cross section view of FIG. 3 after a plasma etch and during an ion implantation step to form the halo/extension implant.

FIG. 4 is a cross section view of FIG. 3 showing ion implantation of ions 30 through first upper surface 23 of semiconductor substrate 20 to form Halo/extension implants 32 and 33 in semiconductor substrate 20 forming structure 28'. First spacer layer 26' along the sidewalls of sacrificial Si gate 24 and sacrificial Si gate 24 form a mask to self align the Halo/extension implants 32 and 33.

Figure 5:
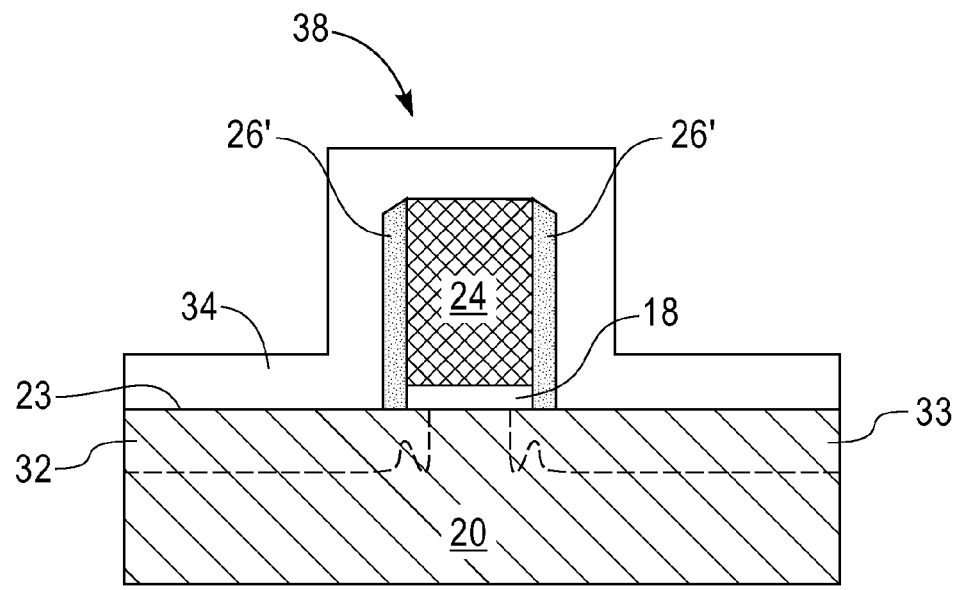
FIG. 5 is a cross section view of FIG. 4 after a second spacer layer is formed.

FIG. 5 is a cross section view of FIG. 4 after a second spacer layer 34 is formed over first spacer layer 26', upper surface 23 and sacrificial Si gate 24 forming structure 38. Second spacer layer 34 may comprise, for example, SiO2, carbon doped oxide, boron nitride, silicon nitride, perfluorocyclobutane (PFCB), fluorosilicate glass (FSG), any stress memory dielectric materials, and low K materials where K is less than 4. Second spacer layer 34 may have a thickness in the range from 20% to 100% of the minimum gate length. The minimum gate length may be the distance between spacers 46 and 48.

Figure 6:
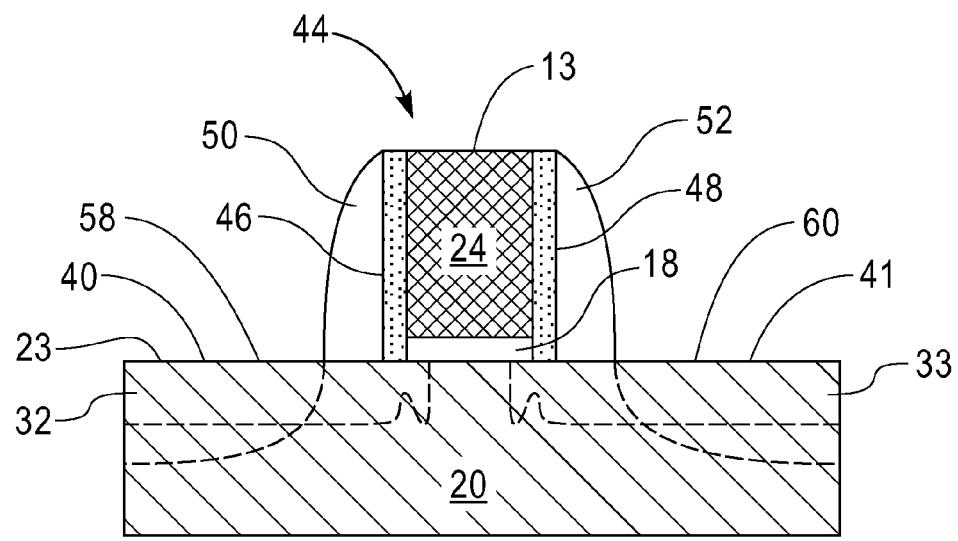
FIG. 6 is a cross section view of FIG. 5 after a plasma etch is performed to form a second sidewall spacer, after a source and drain ion implantation and after an activation anneal of the source and drain regions.

FIG. 6 is a cross section view of FIG. 5 after a plasma etch is performed to form sidewall spacers 50 and 52. The plasma etch removes second spacer layer 34 in field or surface areas 40 and 41 of upper surface 23 of semiconductor substrate 20 and on surface 13 of sacrificial Si gate 24. Further, FIG. 6 is a cross section view of FIG. 5 after a source/drain ion implantation and after an activation anneal of the source/drain regions is performed to form source region 58 and drain region 60 of structure 44. First spacer layer 26' shown in FIG. 5 has portions remaining after plasma etch to form sidewall spacers 46 and 48 on opposite sides of sacrificial Si gate 24. Second spacer layer 34 has portions remaining after plasma etch to form sidewall spacers 50 and 52 over sidewall spacers 46 and 48, respectively, on opposite sides of sacrificial Si gate 24. Sidewall spacers 50 and 52 along with sidewall spacers 46 and 48 function to provide the correct spacing or distance from sacrificial Si gate 24 for self alignment of source and drain regions 58 and 60 to be formed during ion implantation into surface areas 40 and 41 of substrate 20. Source region 58 overlaps Halo/extension implant 32. Drain region 60 overlaps Halo/extension implant 33.

Figure 7:
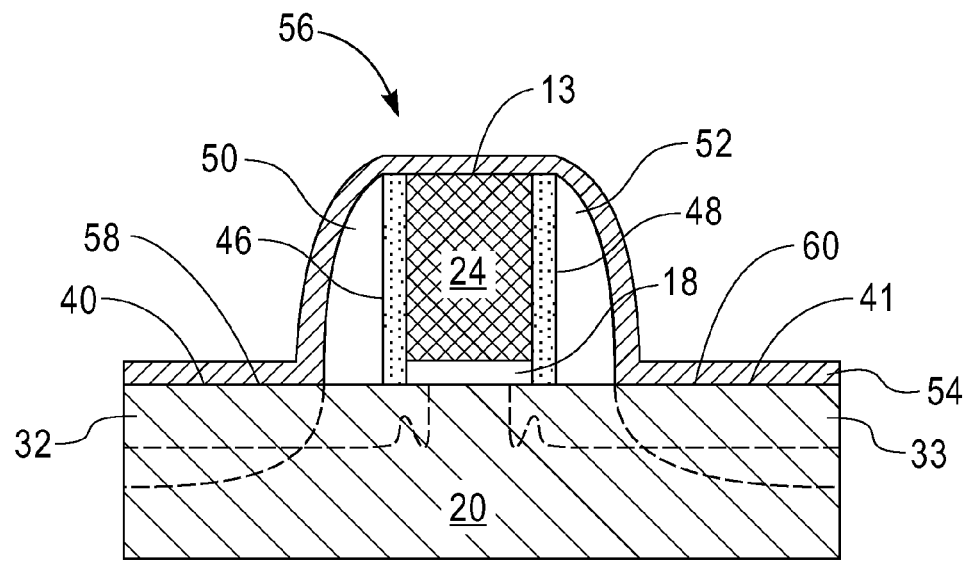
FIG. 7 is a cross section view of FIG. 6 after a metal layer is deposited.
Figure 8:
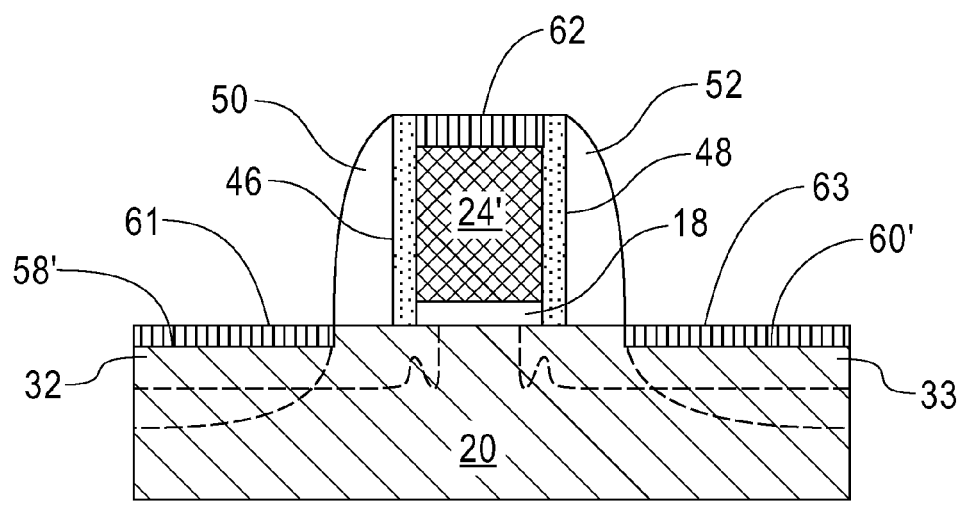
FIG. 8 is a cross section view of FIG. 7 after an anneal is performed to form silicide in the source and drain regions and on the Si gate electrode and after a selective wet etch to remove the remaining metal layer.

A metal silicide may be formed over source region 58 and drain region 60 first before forming a gate dielectric and metal gate as shown in FIGS. 7 and 8. The thermal stability of the metal silicide must be high enough to undergo the subsequent gate dielectric and metal gate process temperatures and thermal budget.

Figure 9:
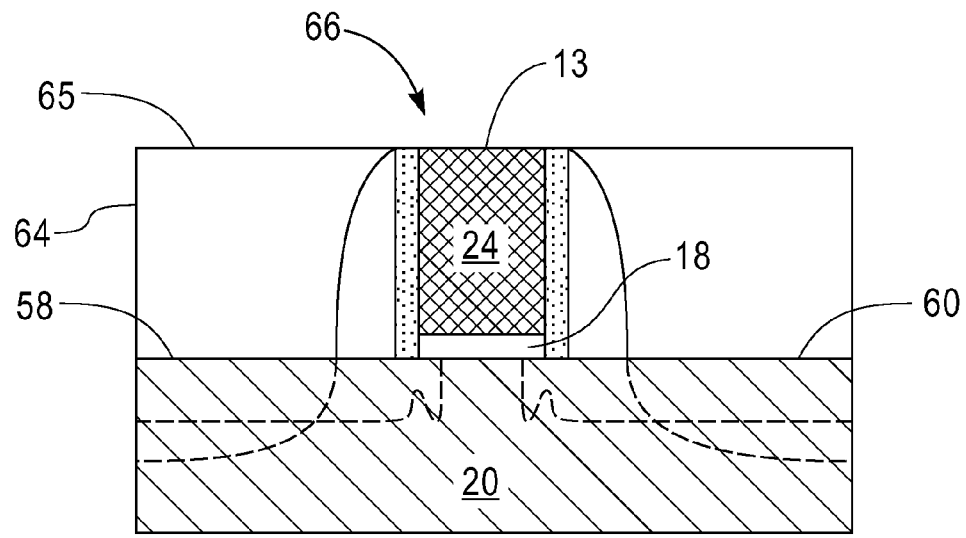
FIG. 9 is a cross section view of FIG. 6 or of FIG. 8, except the silicide regions are not shown in FIG. 9, after a layer of dielectric is formed over the semiconductor structure and after planarization of the layer of dielectric down to the upper surface of the sacrificial Si gate.
Figure 14:
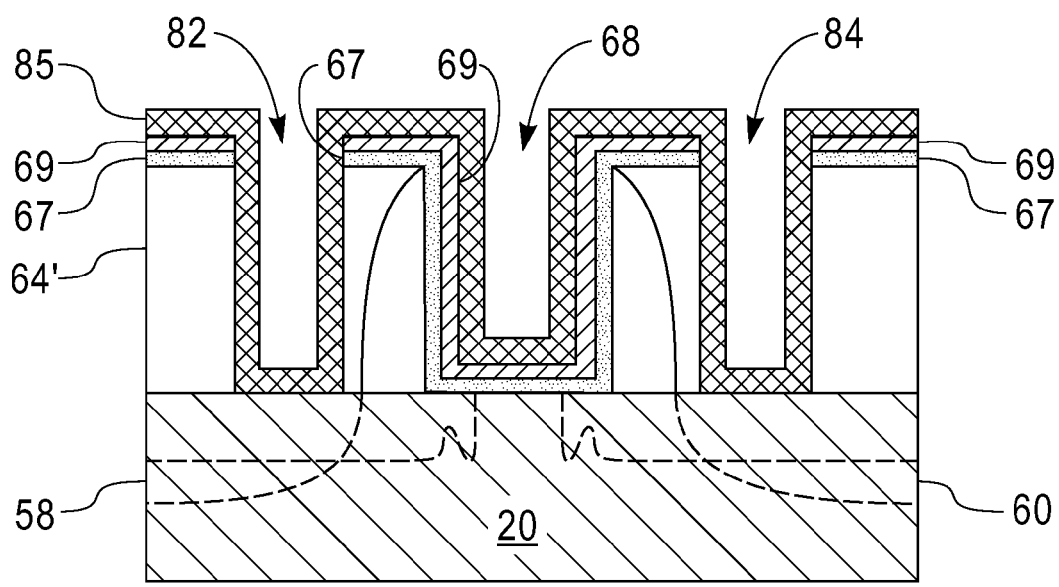
FIG. 14 is a cross section view of FIG. 13 after a metal layer is formed over the semiconductor structure.
Figure 15:
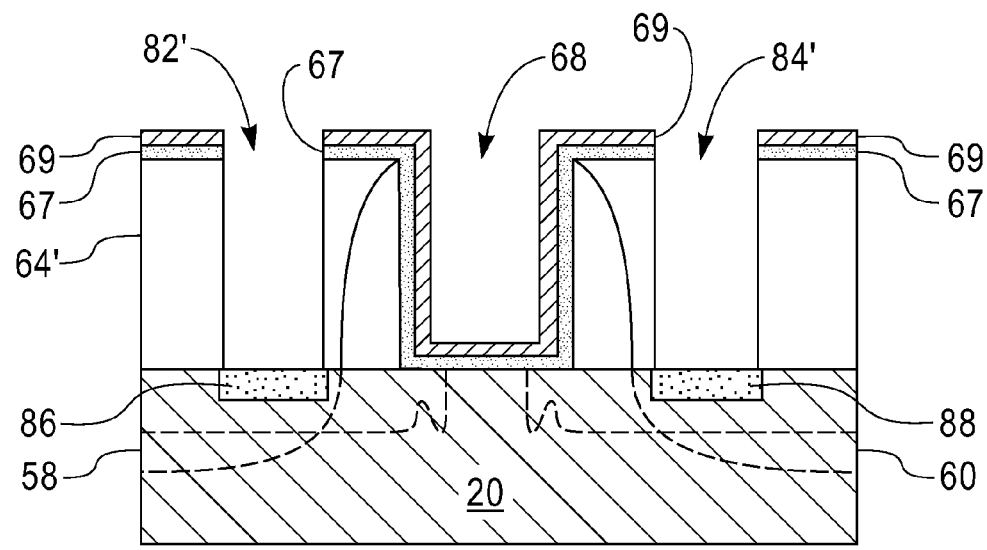
FIG. 15 is a cross section view of FIG. 14 after an anneal and a selective wet etch is performed to form metal silicide regions in the source and drain.

Alternatively, a metal silicide may be formed after the gate dielectric and metal gate are formed by bypassing the metal silicide process illustrated in FIGS. 7 and 8 and proceeding to the process starting with FIG. 9. The metal silicide process illustrated in FIGS. 14 and 15 would be used after performing the processes illustrated in FIGS. 9-13 to form the gate dielectric and metal gate. Openings 82' and 84' in a dielectric layer 64' shown in FIG. 15 are required to form the metal silicide regions 86 and 88 which is limited in area by the size of the openings. With a metal silicide first process shown in FIGS. 7 and 8, the metal silicide is not limited in area by openings in a dielectric layer. The metal silicide regions 61 and 63 extends to all of the exposed Si and extends up to the spacers 50 and 52 shown in FIG. 8.

FIG. 7 is a cross section view of FIG. 6 after a metal layer 54 is formed over surface areas 40 and 41 of upper surface 23 of semiconductor substrate 20 and on upper surface 13 of sacrificial Si gate 24 forming structure 56. Metal layer 54 may comprise Ni formed by blanket physical vapor deposition (PVD), selective chemical vapor deposition (CVD) or electroless plating. Metal layer 54 may comprise metals, for example, Ni, Ti, Co, Sc, Y, Tb, Er, Yb, Ir, Pt and combinations thereof formed by physical vapor deposition (PVD), selective chemical vapor deposition (CVD), electroless plating, electrolytic plating, sputtering and atomic layer deposition (ALD).

FIG. 8 is a cross section view of FIG. 7 after a first anneal at a temperature in the range from 100° C. to 500° C. to react metal layer 54 with silicon in source and drain regions 58 and 60 and sacrificial Si gate 24 to form a metal silicide as shown by metal silicide regions 61, 62 and 63 over source and drain regions 58' and 60' and sacrificial Si gate 24'. A first selective wet etch is then performed to remove unreacted or remaining metal of metal layer 54. A second anneal may be performed to transform high resistance metal rich silicide to a low resistance silicide. A second wet etch may be performed to remove any residue or remaining metal from metal layer 54. Metal silicide region 61 extends from spacer 50 over source region 58' and metal silicide region 63 extends from spacer 52 over drain region 60'.

FIG. 9 is a cross section view of FIG. 6 after dielectric layer 64 is formed over semiconductor structure 44 and after planarization such as by chemical mechanical polishing (CMP) of dielectric layer 64 is performed down to upper surface 13 of sacrificial Si gate 24. Dielectric layer 64 has an upper surface 65 and may be selected from the group consisting of $SiO_2$, CDO (carbon doped oxide), silicon nitride, PFCB (perfluorocyclobutane), FSG (fluorosilicate glass), any stress memory technology dielectric materials, and low K materials (where K is less than 4) and combinations thereof. FIG. 9 shows semiconductor structure 66. If the metal silicide process shown in FIGS. 7 and 8 was performed first, then FIG. 9 would include metal silicide regions 61, 62 and 63 shown in FIG. 8 and metal silicide regions 61 and 63 would be shown in subsequent FIGS. 10-13 and 16-18 in place of metal silicide regions 86 and 88.

Figure 10:
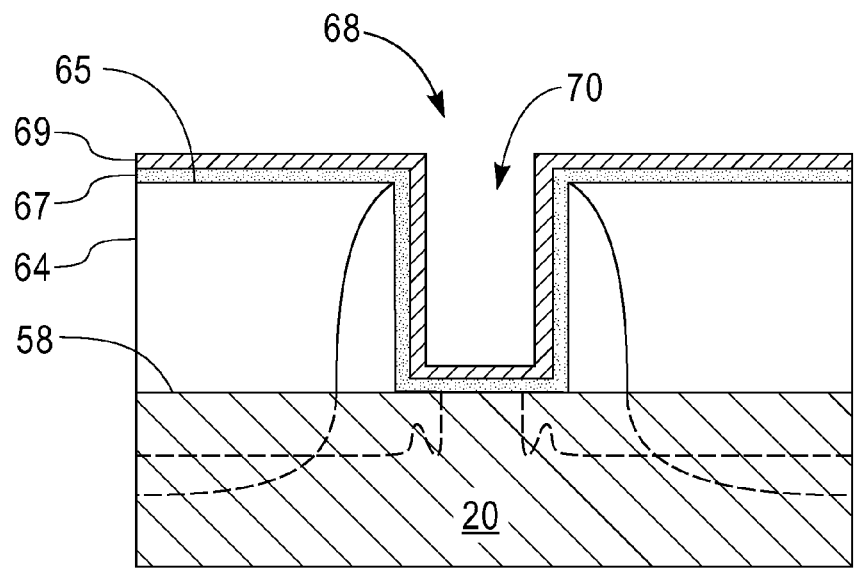
FIG. 10 is a cross section view of FIG. 9 after removal of the first spacer layer, the sacrificial gate dielectric and Si gate electrode and after deposit of a new gate dielectric layer and a metal gate layer.

FIG. 10 is a cross section view of FIG. 9 after sacrificial Si gate 24 and sacrificial gate dielectric 18 is removed forming gate electrode cavity 68. A high K gate dielectric layer 67 is formed on semiconductor substrate 20 at the bottom of cavity 68, on the sidewalls of cavity 68 and on upper surface 65. High K gate dielectric layer 67 may be selected from the group consisting of hafnium oxide, hafnium silicon oxide, hafnium silicon oxynitride, lanthanum oxide, zirconium oxide, zirconium silicon oxide, tantalum oxide, titanium oxide, barium strontium titanium oxide, BST, barium titanium oxide, strontium titanium oxide, yttrium oxide, aluminum oxide, lead scandium tantalum oxide, lead zinc niobate, PZT or combinations thereof.

A metal gate layer 69 is formed over high K gate dielectric layer 67. Metal gate layer 69 is selected to provide a desired work function for N and P type MOSFETs, respectively and to provide a capping layer on high K gate dielectric layer 67. Metal gate layer 69 may provide a diffusion barrier to Cu. FIG. 10 shows the resulting semiconductor structure 70. Metal gate layer 69 may have a suitable work function for N or P type to provide a MOSFET with a desired threshold voltage Vth. Metal gate layer 69 may also provide a barrier liner. Metal gate layer 69 may comprise titanium nitride, tantalum nitride, hafnium, zirconium, a metal carbide, and a conductive metal oxide which meets a Vth (threshold voltage) requirement of the MOSFET to be formed. Two different work function metals for metal gate layer 69 may be required for NMOS and PMOS which involves an NMOS work function metal deposition of metal gate layer 69 and then strip off of PMOS part and then block NMOS and deposit a PMOS work function metal gate layer 69. Metal gate layer 69 may be deposited by CVD, PVD, ALD, electrolytic plating, electroless plating, and epitaxial deposition.

Figure 11:
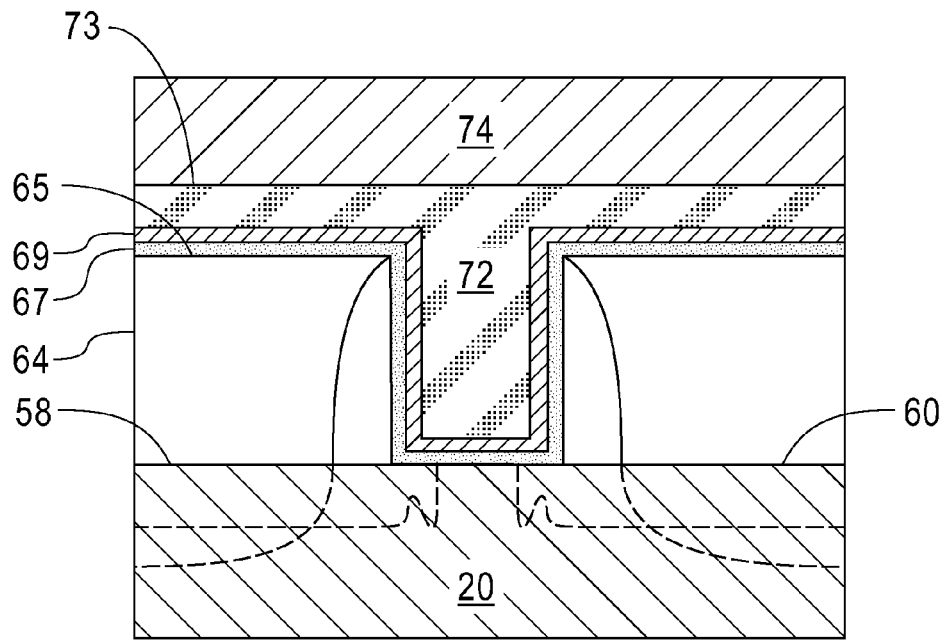
FIG. 11 is a cross section view of FIG. 10 after an organic plarization layer is formed over the structure which fills the gate electrode cavity and after a layer of resist is formed over the organic planarization layer.

FIG. 11 is a cross section view of FIG. 10 after an organic planarization layer 72 is formed over semiconductor structure 70 shown in FIG. 10. Organic planarization layer 72 fills gate electrode cavity 68 completely and covers the upper surface of metal gate layer 69. Organic planarization layer 72 is planarized at a height above upper surface 65. Organic planarization layer 72 may comprise a resist material that gives very good planarization. A resist layer 74 is formed on the upper surface 73 of organic planarization layer 72.

Figure 12:
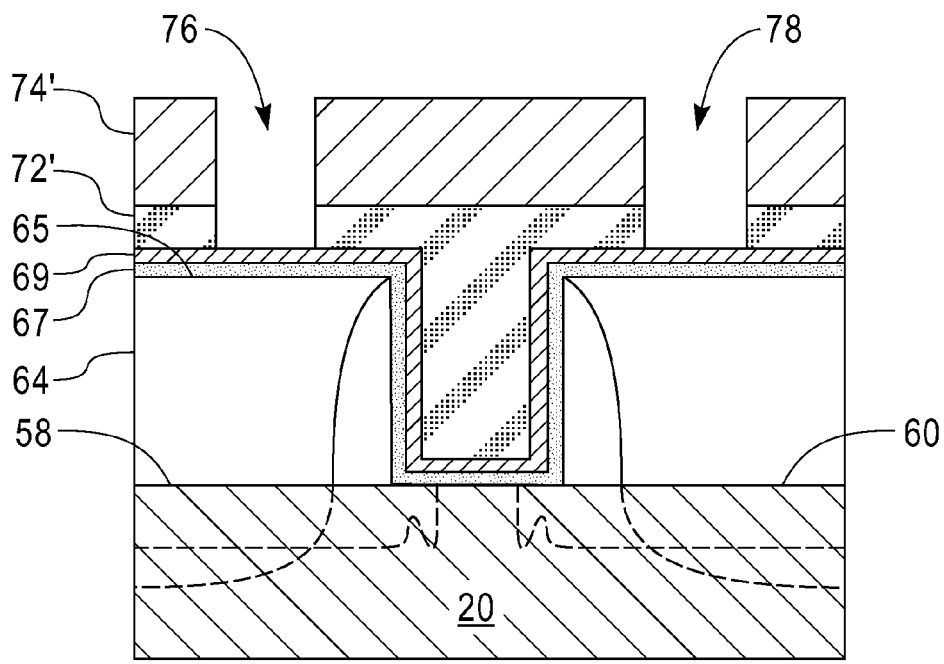
FIG. 12 is a cross section view of FIG. 11 showing openings through an organic planarization layer and a layer of resist.

FIG. 12 is a cross section view of FIG. 11 after resist layer 74 has been patterned to form respective openings 76 and 78 above source region 58 and drain region 60 respectively in resist layer 74' and organic planarization layer 72' down to metal gate layer 69.

Figure 13:
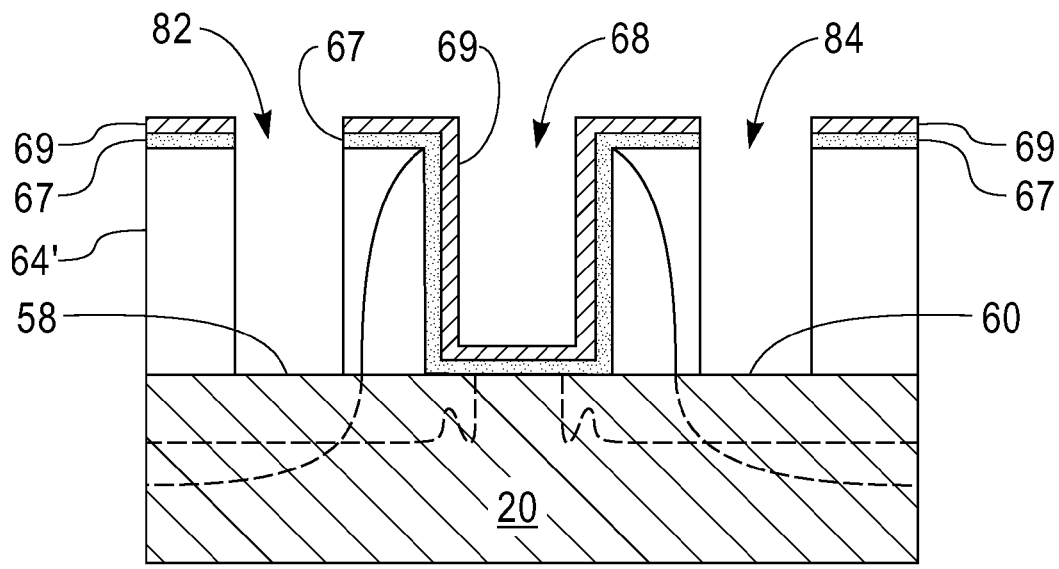
FIG. 13 is a cross section view of FIG. 12 after openings are formed through the layer of dielectric to the source and drain regions and after removal of the resist layer and the organic planarization layer.

FIG. 13 is a cross section view of FIG. 12 showing openings 82 and 84 extended through metal gate layer 69, high K gate dielectric layer 67 and dielectric layer 64' which extend down to source region 58 and drain region 60, respectively. Resist layer 74' shown in FIG. 12 is removed. After openings 82 and 84 have been formed, organic planarization layer 72' shown in FIG. 12 is removed reforming gate cavity 68. If metal silicide regions 61 and 63 had been formed earlier as shown in FIGS. 7 and 8, then FIG. 13 would have metal silicide regions 61 and 63 and the process as shown in FIGS. 14 and 15 would not be performed. The next process would be as describe with reference to FIG. 16 with metal silicide regions 86 and 88 replaced with metal silicide regions 61 and 63 shown in FIG. 8.

FIG. 14 is a cross section view of FIG. 13 after a metal layer 85 has been formed on metal gate layer 69, opening 82, gate cavity 68 and opening 84. Metal layer 85 may comprise Ni formed by blanket physical vapor deposition (PVD), selective chemical vapor deposition (CVD) or electroless plating. Metal layer 85 may comprise metals, for example, Ni, Ti, Co, Sc, Y, Tb, Er, Yb, Ir, Pt and combinations thereof formed by physical vapor deposition (PVD), selective chemical vapor deposition (CVD), electroless plating, electrolytic plating, sputtering and atomic layer deposition (ALD).

FIG. 15 is a cross section view of FIG. 14 after a first anneal at a temperature in the range from 100° C. to 500° C. and selective wet etching to remove unsilicided metal to form metal silicide regions 86 and 88 at the bottom of openings 82 and 84, respectively, to provide electrical ohmic contact to source region 58 and drain region 60, respectively. A second anneal is optional to transform high resistance metal rich silicide to a low resistance silicide. A second wet clean may be performed to remove residual metal i.e. unsilicided materials.

Figure 16:
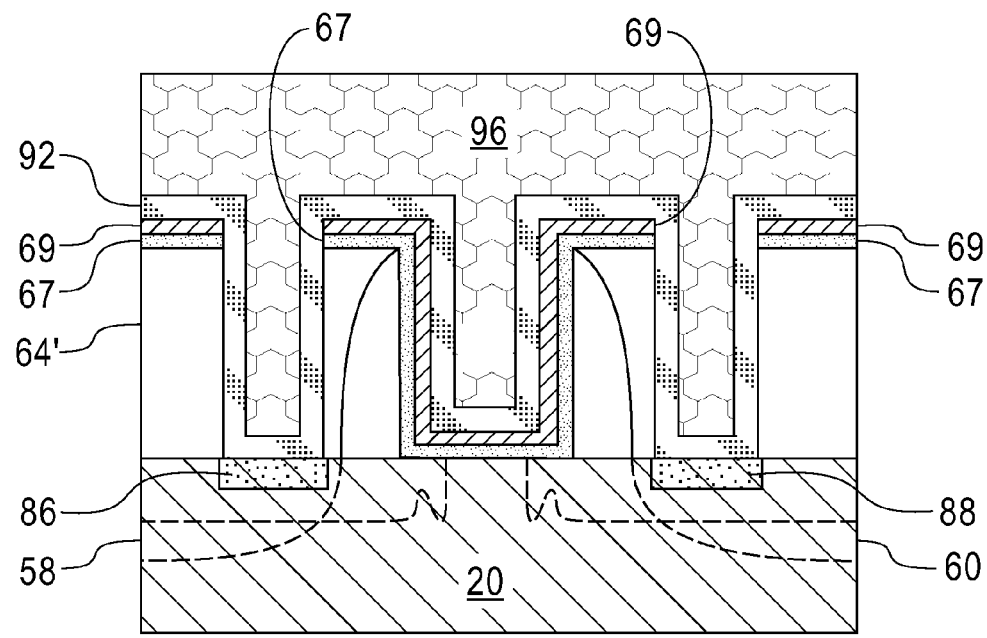
FIG. 16 is a cross section view of FIG. 15 after a first metal layer is formed over the semiconductor structure and a second metal layer is formed over the first metal layer and which fills the source, drain and gate openings.

FIG. 16 is a cross section view of FIG. 15 after a first metal liner layer 92 has been formed on metal gate layer 69, opening 82, gate cavity 68 and opening 84. FIG. 16 shows a second metal layer 96 formed over first metal liner layer 92. Second metal layer 96 fills the remaining volume of opening 82, gate cavity 68 and opening 84. Metal liner layer 92 may have a suitable work function to provide a MOSFET with a desired threshold voltage Vth. Metal layer 92 may also provide a barrier liner such as to Cu. First metal liner layer 92 may comprise tantalum, titanium, titanium nitride, tantalum nitride, titanium silicon nitride, ruthenium, ruthenium oxide, ruthenium phosphorus, hafnium, zirconium, a metal carbide, a conductive metal oxide and combinations thereof which meets a threshold voltage Vth requirement of the MOSFET to be formed. Two different work function metals may be required for NMOS and PMOS which involves NMOS work function metal deposition of metal layer 92 and then strip off of PMOS part and then block NMOS and deposit a PMOS work function metal layer 92. Metal layer 92 may be deposited by CVD, PVD, ALD, electrolytic plating, electroless plating, and epitaxial deposition.

Figure 17:
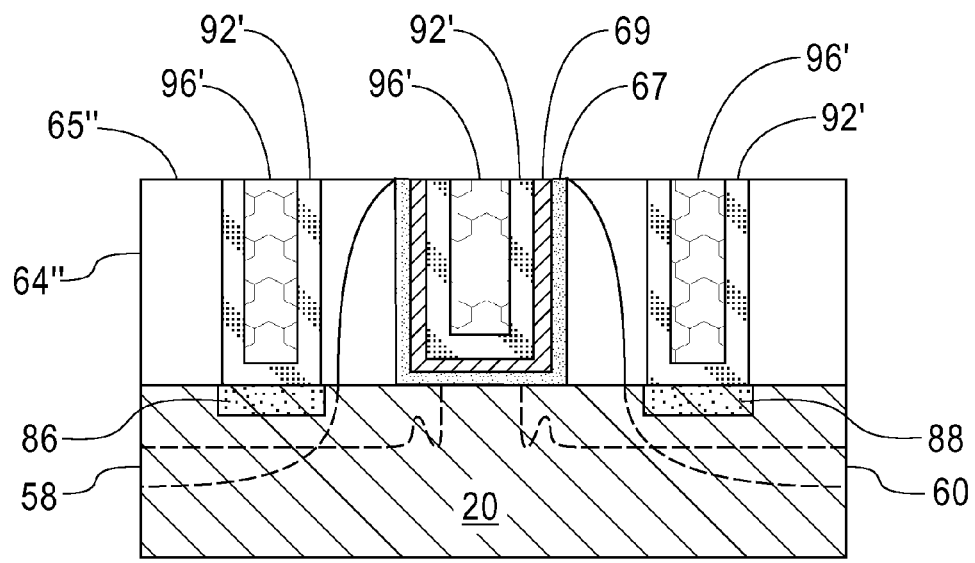
FIG. 17 is a cross section view of FIG. 16 after the step of chemical mechanical polishing the first and second metal layers down to the upper surface of the layer of dielectric.

FIG. 17 is a cross section view of FIG. 16 after second metal layer 96 and first metal liner layer 92 are polished. Second metal layer 96' and first metal liner layer 92' are polished via chemical mechanical polish down to upper surface 65' of dielectric layer 64'. Second metal layer 96' may comprise copper, ruthenium, palladium, platinum, cobalt, nickel, ruthenium oxide, tungsten, aluminum, titanium, tantalum, hafnium zirconium, a metal carbide, carbon nano tube, and a conductive metal oxide.

Figure 18:
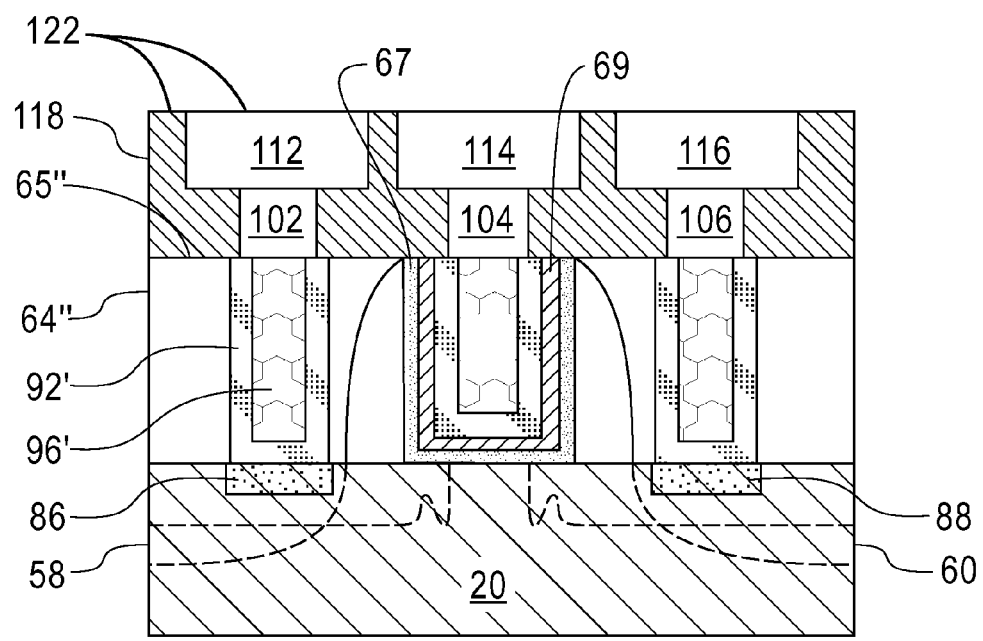
FIG. 18 is a cross section view of FIG. 17 after metal vias and wiring metallization is formed over the semiconductor structure of FIG. 17.

FIG. 18 is a cross section view of FIG. 17 after metal vias 102, 104 and 106 and metallization 112, 114 and 116 respectively have been formed in dielectric layer 118 above upper surface 65' to contact those areas of first metal liner layer 92' and second metal layer 96' in dielectric layer 64' to contact source 58 (by way of metal silicide 86), the gate electrode and drain 60 (by way of metal silicide 88). As shown in FIG. 18, metallization 112, 114, and 116 and dielectric layer 118 has an upper surface 122 which has been planarized by chemical mechanical polishing. Metal vias 102, 104 and 106 may be formed in dielectric layer 118 by either a single damascene process or by a dual damascene process.

While there has been described and illustrated a method for fabricating a MOSFET with common metal process to make contact to the source, drain and gate electrode formed at the same time or concurrently with the same metal or metals, it will be apparent to those skilled in the art that modifications and variations are possible without deviating from the broad scope of the invention which shall be limited solely by the scope of the claims appended hereto.

What is claimed is:

1. A method for forming a field effect transistor comprising:
   selecting a Si containing substrate having a source, drain and channel regions, said channel region having a sacrificial gate dielectric, sacrificial Si gate electrode and sidewall spacers thereover, then
   forming a metal silicide only in said source and drain regions,
   forming a first dielectric layer thicker than and over said sacrificial Si gate electrode,
   planarizing said first dielectric layer down to said sacrificial Si gate electrode,
   removing said sacrificial gate dielectric and said sacrificial Si gate electrode, then
   forming a second dielectric layer on said channel region, then
   forming a metal gate layer over said second dielectric layer, then
   forming openings in said first and second dielectric layers to said source and drain regions,
   forming a first metal liner layer over said metal silicide in said source and drain regions and over said metal gate layer, and over sidewalls of said openings in said first and second dielectric layers,
   forming a second metal layer over said first metal liner layer having a thickness to fill said openings, and
   planarizing said first metal layer and said second metal layer down to said first dielectric layer.

2. The method of claim 1 wherein said forming a first metal liner layer includes forming a layer selected from the group consisting of tantalum, titanium, titanium nitride, tantalum nitride, titanium silicon nitride, ruthenium, ruthenium oxide, ruthenium phosphorus, hafnium, zirconium, aluminum, manganese, copper manganese, iridium, copper iridium, cobalt, cobalt tungsten, cobalt tungsten phosphorus, tungsten, lanthanum, lutetium, transition metal elements, rare earth elements, a metal carbide, a conductive metal oxide and combinations thereof.

3. The method of claim 1 wherein said forming a second metal layer includes forming a layer selected from the group consisting of copper, ruthenium, palladium, platinum, cobalt, nickel, ruthenium oxide, tungsten, aluminum, manganese, cobalt tungsten, cobalt tungsten phosphorus, titanium, tantalum, hafnium zirconium, transition metal elements, rare earth elements, a metal carbide, carbon nano tubes, a conductive metal oxide and combinations thereof.

4. The method of claim 1 wherein said forming a second dielectric layer includes forming a high K dielectric layer.

5. The method of claim 1 wherein said forming a metal gate layer includes forming a metal gate layer over said second dielectric layer over said channel region.

6. The method of claim 1 wherein said forming openings includes forming openings in said metal gate layer and said first and second dielectric layers.

7. The method of claim 1 wherein said forming a first metal liner layer includes forming a first metal liner layer over said metal gate layer over said channel region and over said sidewall spacers.

8. The method of claim 1 wherein said forming a second metal includes forming a second metal over said first metal liner layer having a thickness to fill an opening over said first metal liner layer over said channel region left by removing said sacrificial gate dielectric and said sacrificial Si gate electrode.

9. A method for forming a field effect transistor comprising:
   selecting a Si containing substrate having a source, drain and channel regions, said channel region having a sacrificial gate dielectric, sacrificial Si gate electrode and sidewall spacers thereover, then
   forming a metal silicide in said source and drain regions,
   forming a first dielectric layer thicker than and over said sacrificial Si gate electrode,
   planarizing said first dielectric layer down to said sacrificial Si gate electrode,
   removing said sacrificial gate dielectric and said sacrificial Si gate electrode, then
   forming a second dielectric layer on said channel region, then
   forming a metal gate layer over said second dielectric layer, then
   forming openings in said first and second dielectric layers to said source and drain regions,
   forming a first metal liner layer over said metal silicide in said source and drain regions and over said metal gate layer, and over sidewalls of said openings in said first and second dielectric layers,
   forming a second metal layer over said first metal liner layer having a thickness to fill said openings, and
   planarizing said first metal layer and said second metal layer down to said first dielectric layer.

10. The method of claim 9 wherein said forming a first metal liner layer includes forming a layer selected from the group consisting of tantalum, titanium, titanium nitride, tantalum nitride, titanium silicon nitride, ruthenium, ruthenium oxide, ruthenium phosphorus, hafnium, zirconium, aluminum, manganese, copper manganese, iridium, copper iridium, cobalt, cobalt tungsten, cobalt tungsten phosphorus, tungsten, lanthanum, lutetium, transition metal elements, rare earth elements, a metal carbide, a conductive metal oxide and combinations thereof.

11. The method of claim 9 wherein said forming a second metal layer includes forming a layer selected from the group consisting of copper, ruthenium, palladium, platinum, cobalt, nickel, ruthenium oxide, tungsten, aluminum, manganese, cobalt, cobalt tungsten, cobalt tungsten phosphorus, titanium, tantalum, hafnium zirconium, transition metal elements, rare earth elements, a metal carbide, carbon nano tubes, a conductive metal oxide and combinations thereof.

12. The method of claim 9 wherein said forming a second dielectric layer includes forming a high K dielectric layer.

13. The method of claim 9 wherein said forming a metal gate layer includes forming a metal gate layer over said second dielectric layer over said channel region.

14. The method of claim 9 wherein said forming openings includes forming openings in said metal gate layer and said first and second dielectric layers.

15. The method of claim 9 wherein said forming a first metal liner layer includes forming a first metal liner layer over said metal gate layer over said channel region and over said sidewall spacers.

16. The method of claim 9 wherein said forming a second metal includes forming a second metal over said first metal liner layer having a thickness to fill an opening over said first metal liner layer over said channel region left by removing said sacrificial gate dielectric and said sacrificial Si gate electrode.

* * * * *